(12) United States Patent
Ogawa et al.

(10) Patent No.: US 6,680,435 B1
(45) Date of Patent: Jan. 20, 2004

(54) ELECTRONIC DEVICE AND METHOD OF FABRICATING THE SAME

(75) Inventors: Toshio Ogawa, Hitachinaka (JP); Masaaki Takahashi, Hitachi (JP); Noritaka Kamimura, Hitachinaka (JP); Kazuji Yamada, Hitachi (JP); Toshiaki Kaminaga, Naka-machi (JP)

(73) Assignee: Hitachi, Ltd., Tokyo (JP)

( * ) Notice: Subject to any disclaimer, the term of this patent is extended or adjusted under 35 U.S.C. 154(b) by 137 days.

(21) Appl. No.: 09/628,756

(22) Filed: Jul. 31, 2000

(30) Foreign Application Priority Data

Aug. 4, 1999   (JP) .......................................... 11-220785

(51) Int. Cl.$^7$ ............................................. H01L 23/28
(52) U.S. Cl. ....................... 174/52.2; 438/127; 257/787; 174/52.3; 174/52.4
(58) Field of Search ............................... 174/52.2, 52.3, 174/52.4; 361/748, 760, 783; 257/738, 778, 780, 787, 788; 438/106, 126, 127, 112

(56) References Cited

U.S. PATENT DOCUMENTS

| 4,899,209 | A | * | 2/1990 | Shibata et al. ................ 357/74 |
| 5,218,234 | A | * | 6/1993 | Thompson et al. .......... 257/787 |
| 5,311,059 | A |   | 5/1994 | Banerji et al. |
| 5,385,869 | A | * | 1/1995 | Liu et al. ..................... 437/209 |
| 5,490,324 | A | * | 2/1996 | Newman ...................... 29/830 |
| 5,590,462 | A | * | 1/1997 | Hundt et al. .................. 29/840 |
| 5,710,071 | A |   | 1/1998 | Beddingfield et al. |
| 5,774,342 | A | * | 6/1998 | Brandenburg et al. ...... 361/774 |
| 5,981,312 | A | * | 11/1999 | Farquhar et al. ............ 438/112 |
| 6,074,897 | A |   | 1/2000 | Degani et al. |
| 6,038,136 | A | * | 3/2000 | Weber ......................... 361/783 |

* cited by examiner

*Primary Examiner*—Dean A. Reichard
*Assistant Examiner*—Carmelo Oliva
(74) *Attorney, Agent, or Firm*—Hogan & Hartson, LLP

(57) ABSTRACT

An electronic device has a wiring board mounted with an electronic circuit chip. A recess or through-hole is formed in a major surface of the wiring board on which the electronic circuit chip is mounted at a position corresponding to a central portion of the electronic circuit chip. Air trapped in a space between the electronic circuit chip and the wiring board is collected in the recess or through-hole to form a void separated from the electronic circuit chip.

5 Claims, 7 Drawing Sheets

ELECTRONIC DEVICE AND METHOD OF FABRICATING THE SAME

BACKGROUND OF THE INVENTION

1. Field of the Invention

The present invention relates to an electronic device formed by sealing a semiconductor device or a passive device in a resin package, and an electronic igniter.

2. Description of the Related Art

The following problems arises when sealing a semiconductor device mounted on a wiring board by flip-chip bonding in a resin package by a transfer molding process. The resin flows from all directions into a narrow region sandwiched between the semiconductor device and the wiring board, encloses a gas in a central portion of the region to form voids. The voids deteriorates the reliability of the semiconductor device. A method proposed in, for example, Japanese Patent Laid-open No. Hei 10-335386 to solve such a problem fills up the region underlying the semiconductor device with another resin. This method supplies a fluidic first resin in a resin layer onto a wiring board provided with pads by potting (or underfill) and presses a semiconductor device provided with bumps against the resin layer so that the bumps are joined to the pads, and seals the semiconductor device and the wiring board in a package of a second resin to complete an electronic device.

This method needs a first step for potting and a second step for packaging, and must select the first and the second resin so that the first and the second resin have properties suitable for the optimum combination of the resins and hence must select the resins from limited possible kinds of resins.

Accordingly, it is an object of the present invention to provide an electronic device with high reliability capable of being fabricated by a method having a small number of steps.

SUMMARY OF THE INVENTION

According to a first aspect of the present invention, an electronic device comprises at least one electronic circuit chip, such as a semiconductor device or a passive device, having first and second major surfaces, a wiring board having a first major surface on which the electronic circuit chip is mounted, a connecting part having a resin layer sandwiched between the electronic circuit chip and the wiring board, spacing the electronic circuit chip a predetermined distance apart from the wiring board and permitting the electronic circuit chip to be electrically connected to circuits formed on the wiring board, a base plate for supporting the electronic circuit chip, the wiring board and the connecting part, and a resin package sealing the electronic circuit chip, the wiring board, the connecting part and the base plate therein; wherein the resin layer and the resin package are formed of substantially the same materials, respectively.

Preferably, a recess or a through-hole is formed in the major surface of the wiring board at a position corresponding to a central portion of the electronic device.

Preferably, the volume $V_2$ of the recess formed in the wiring board is at least 1/100 of the volume $V_1$ of a region between the wiring board and the electronic circuit chip.

Preferably, the wiring board is formed of a ceramic material or a material in which a resin is a principal component.

According to a second aspect of the present invention, a method of fabricating an electronic device comprises the steps of: making a wiring board having a major surface; forming a recess in the major surface of the wiring board; mounting at least one electronic circuit chip on the major surface of the wiring board; and sealing the wiring board and the electronic circuit chip in a resin package.

Preferably, the step of sealing the wiring board, the electronic circuit chip in the resin package is carried out by either a transfer molding process using a thermosetting resin or an injection molding process using a thermoplastic resin.

According to the present invention, the electronic circuit chip is mounted on the major surface of the wiring board, and the recess or through-hole having an opening is formed in the major surface of the wiring board at a position in a region corresponding to the electronic circuit chip. Therefore, a gas confined in a region between the electronic circuit chip and the wiring board in the step of sealing the wiring board and the electronic circuit chip with a resin package can be collected in the recess. Consequently, any voids touching the surface of the electronic circuit chip are not formed, which enhances the reliability of the electronic device.

The step of forming the recess in the major surface of the wiring board and the step of sealing the wiring board and the electronic circuit chip in a resin package prevent the formation of voids touching the surface of the electronic circuit chip, which enhances the reliability of the electronic device.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

First Embodiment

In the following, embodiments according to the present invention will be described but the present invention is not limited thereto.

Figure 1:
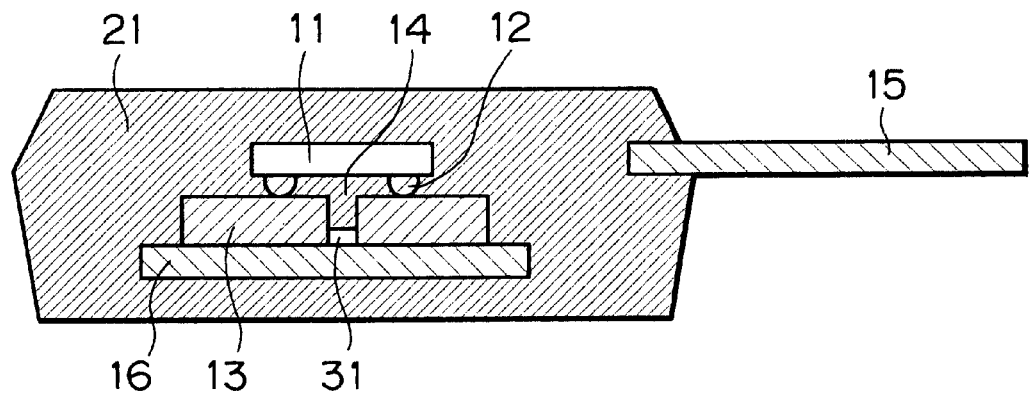
FIG. 1 is a sectional view of an electronic device in a first embodiment according to the present invention.

Referring to FIG. 1 showing an electronic device in a first embodiment according to the present invention, a semiconductor device 11 for driving, for example, an IGBT (insulated-gate bipolar transistor), is bonded to a major surface A of a glass-epoxy wiring board 13 by bonding parts 12, such as solder bumps. At least one through-hole 14 is formed in the wiring board 13 so as to open toward the major surface A of the wiring board 13 at a position substantially corresponding to a central portion of the semiconductor device 11. The wiring board 13 is fixed to a base plate 16. The semiconductor device 11, the wiring board 13 and the base plate 16 are sealed in a resin package 21 formed by a transfer molding process using a pressure $P_1$ of 10 MPa. In the transfer molding process, the resin flows substantially simultaneously from all directions into a space between the semiconductor device 11 and the wiring board 13 and, consequently, a gas, such as air, is trapped in the space. Since the trapped gas is collected in the recess 14 and concentrated on a void 31, the semiconductor device 11 is covered with and protected by the resin forming the resin package 21.

The volume $V_2$ of the through-hole 14 must be large enough to contain the trapped gas, generally, air. A maximum volume $V_1$ of the gas that may be trapped in the space is expressed by:

$$V_1 = (\text{Area of the device 11}) \times (\text{Distance between the device 11 and the wiring board 13}) - (\text{Volume of solder bumps})$$

Therefore, $$V_2 = V_1 \times P_1 / P_2 = V_1 / 100$$

where $P_1$ is the atmospheric pressure=0.1 MPa and $P_2$=10 MPa is a pressure applied to the resin in the transfer molding process. Thus, the volume $V_2$ must be at least 1/100 of the volume $V_1$.

Figure 2:
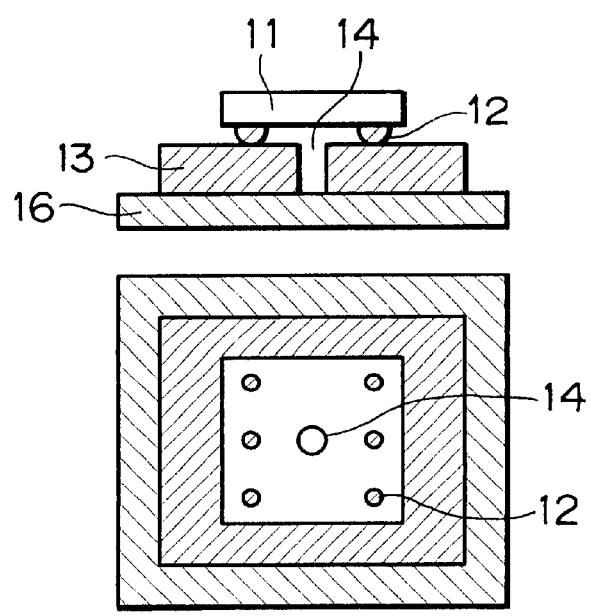
FIG. 2 is a sectional view and a plan view of the electronic device shown in FIG. 1.
Figure 3:
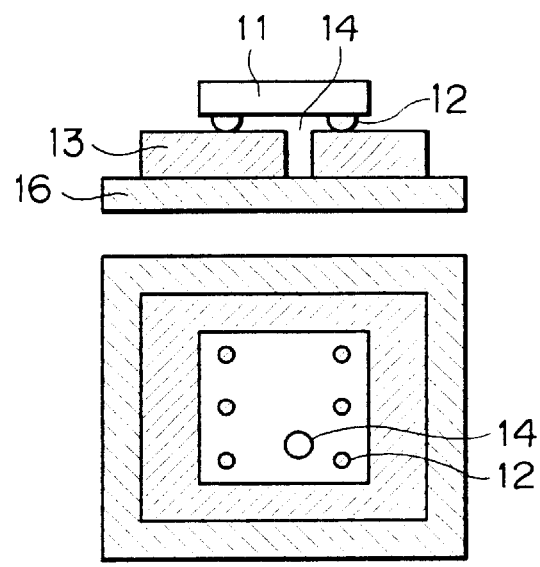
FIG. 3 is sectional view and a plan view of an electronic device in a modification of the electronic device shown FIG. 1.
Figure 4:
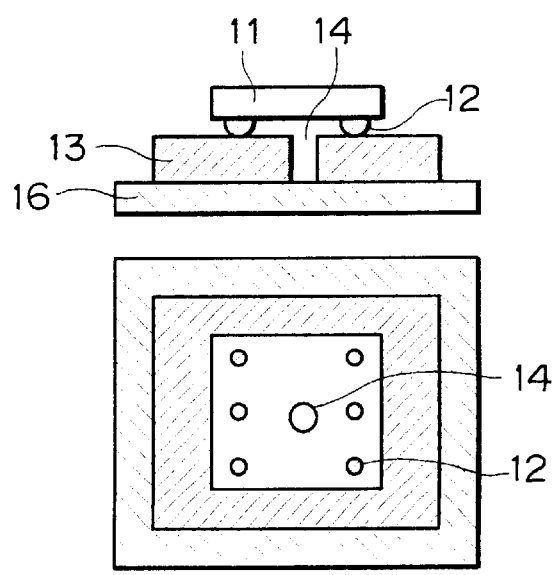
FIG. 4 is a sectional view and a plan view of an electronic device in another modification of the electronic device shown in FIG. 1.
Figure 5:
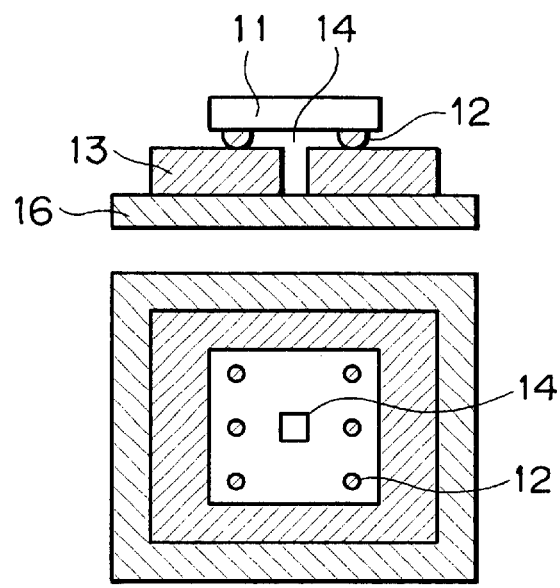
FIG. 5 is a sectional view and a plan view of an electronic device in another modification of the electronic device shown in FIG. 1.
Figure 6:
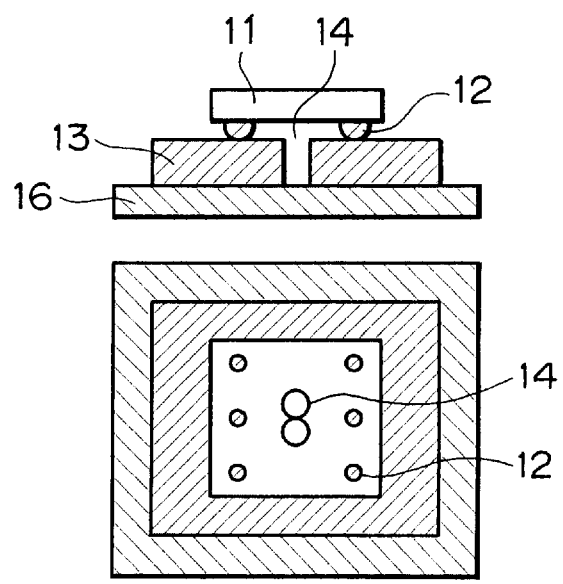
FIG. 6 is a sectional view and a plan view of an electronic device in another modification of the electronic device shown in FIG. 1.

Referring to FIG. 2, the through-hole 14 is formed in a cylindrical shape in a portion of the wiring board corresponding to a central portion of the semiconductor device 11. It is preferable to form the through-hole 14 so as to correspond to the central portion of the semiconductor device as shown in FIGS. 1 and 2. It is undesirable that the through-hole 14 does not correspond to the central portion of the semiconductor device 11 as shown in FIGS. 3 and 4. If the through-hole 14 is dislocated from a position corresponding to the central portion of the semiconductor device 11 as shown in FIG. 3 or 4, the effect of the present invention is not enough exercised. An electronic device shown in FIG. 5 in a first modification of the electronic device shown in FIG. 1 is provided with a through-hole 14 of a rectangular cross section. The electronic device may be provided with a through-hole 14 of a polygonal cross section. An electronic device shown in FIG. 6 in a second modification of the electronic device shown in FIG. 1 is provided with two cylindrical through-holes 14.

Figure 7:
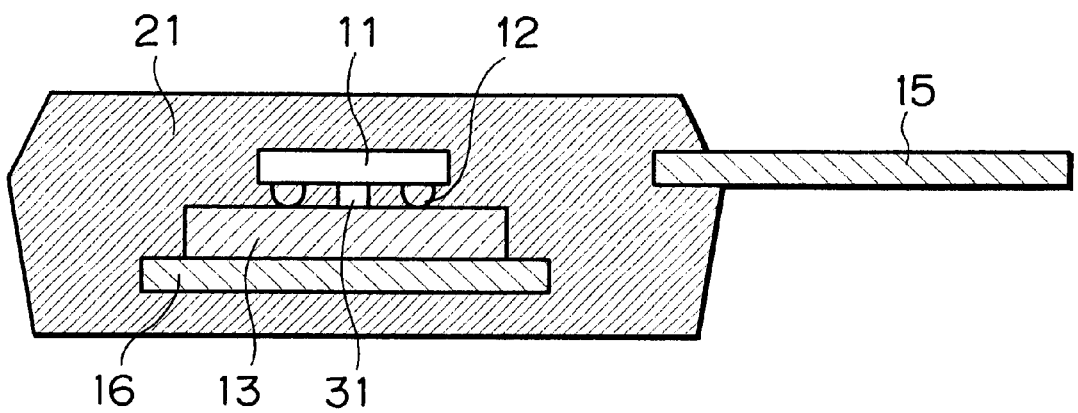
FIG. 7 is a sectional view of a prior art electronic device.
Figure 8:
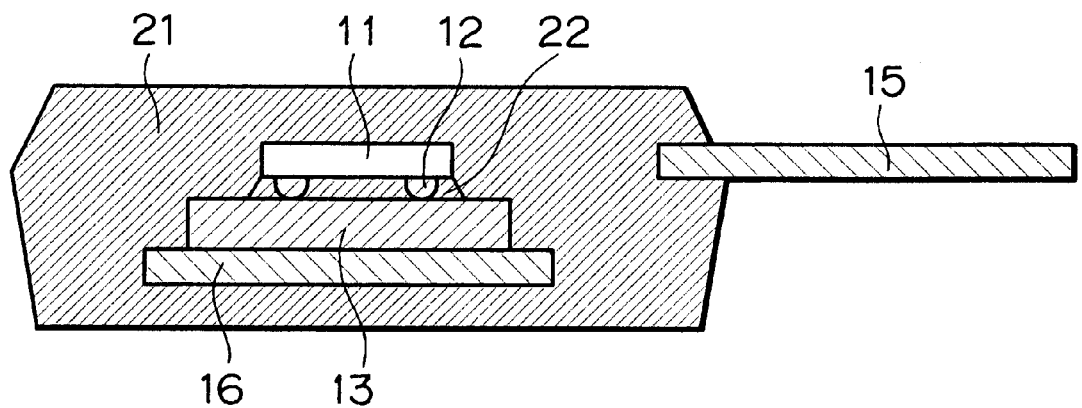
FIG. 8 is a sectional view of another prior art electronic device.

FIGS. 7 and 8 show prior art electronic devices as comparative examples. The prior art electronic device shown in FIG. 7 has a wiring board 13 not provided with any recess or any through-hole and the resin package 21 is directly formed. In this structure, a void 31 touching a semiconductor device 11 is formed by trapped air under the semiconductor device 11. The void 31 affects adversely to the reliability of the electronic device; that is, it is possible that external moisture leaks through a resin package 21 and condenses in the void 31 to affect adversely to the characteristic of the semiconductor device 11. The void 31 promotes the irregular stress distribution in the electronic device and may possibly cause the semiconductor device 11 to malfunction.

The electronic device shown in FIG. 8 is formed by filling a resin layer 22 on a wiring board 13 held on a base plate 16 by potting, putting a semiconductor device 11 on the resin layer 22 and sealing the semiconductor device 11, the wiring board 13, the resin layer 22 and the base plate 16 in a resin package 21. Although any void like the void 31 shown in FIG. 7 is not formed, this electronic device needs an increased number of steps for fabrication and is subject to restrictions on the selection of the resins forming the resin package 21 and the resin layer 22.

Second Embodiment

Figure 9:
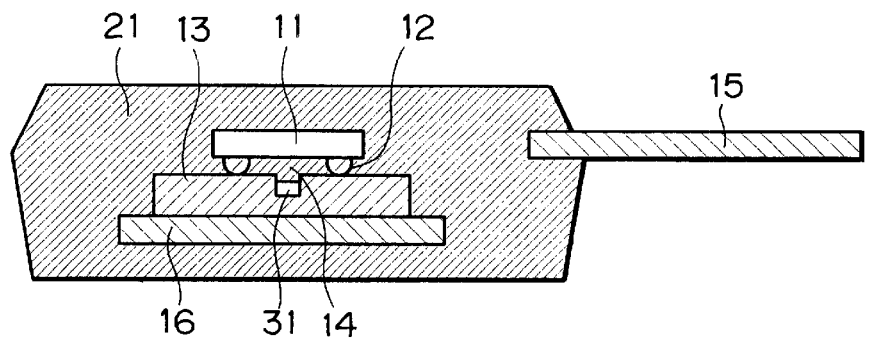
FIG. 9 is a sectional view of an electronic device in a second embodiment according to the present invention.

An electronic device in a second embodiment according to the present invention shown in FIG. 9 is substantially the same in construction to the electronic device in the first embodiment. Whereas the wiring board 13 of the electronic device in the first embodiment is provided with the through-hole 14, the electronic device in the second embodiment has a wiring board 13 provided with a recess 14. The recess 14 is formed in dimensions large enough to form a void 31 large enough to collect trapped air therein.

Figure 10:
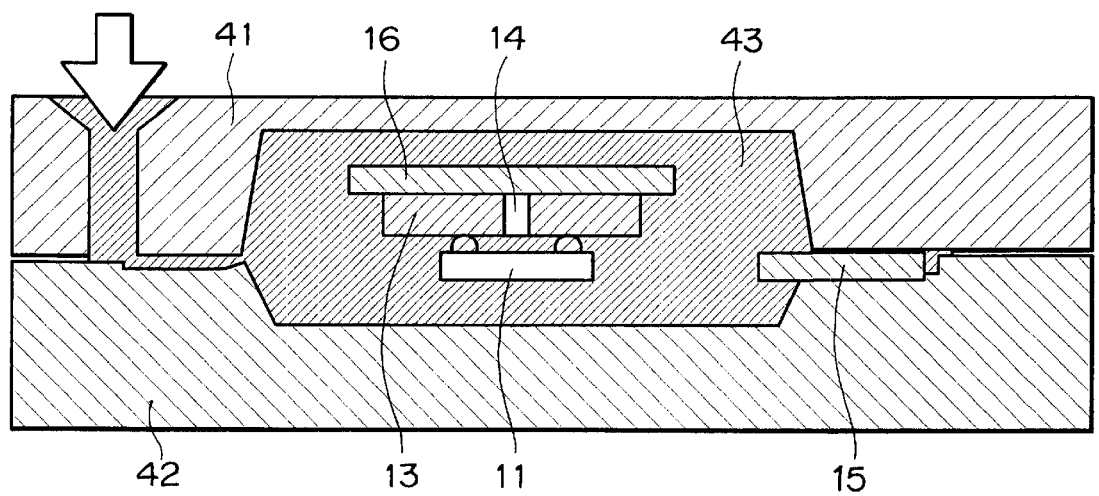
FIG. 10 is a sectional view of assistance in explaining a resin package forming process in fabricating an electronic device embodying the present invention.

FIG. 10 is a sectional view of assistance in explaining a process of forming the resin package 21 of the electronic device in the first embodiment. The assembly of the component parts is set in a cavity 43 defined by an upper half mold 41 and a lower half mold 42, and the resin is injected by pressure into the cavity 43 to mold the resin package 21. In this process, it is important to set the assembly of the component parts properly in the cavity 43. As shown in FIG. 10, the assembly is set in an inverted position so that the through-hole 14 opens downward to facilitate the collection of the gas in the through-hole 14.

Third Embodiment

Figure 11:
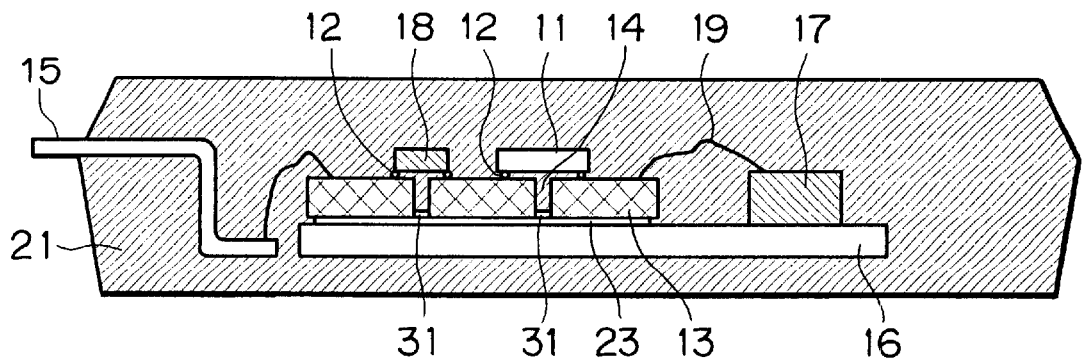
FIG. 11 is a sectional view of an electronic igniter embodying the present invention.
Figure 13:
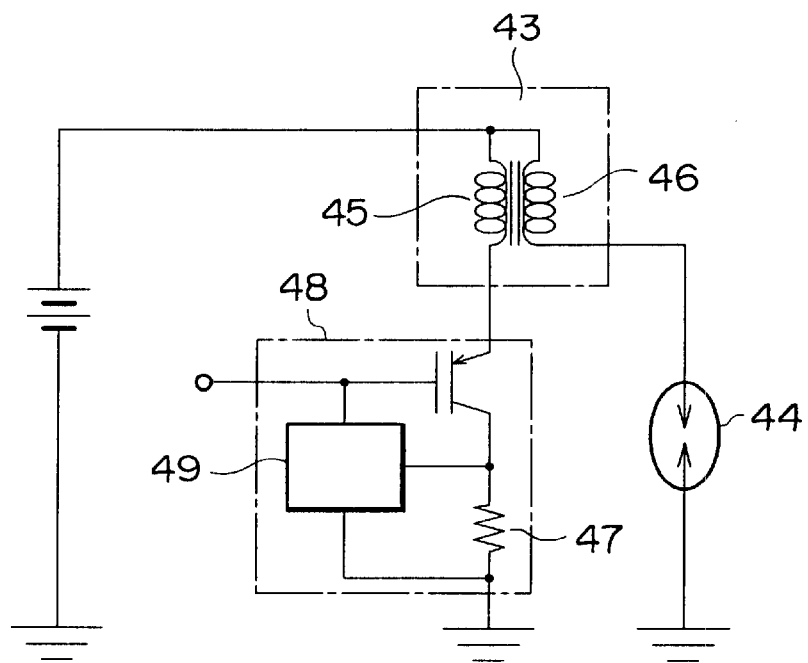
FIG. 13 is a circuit diagram of the electronic igniter embodying the present invention.
Figure 12:
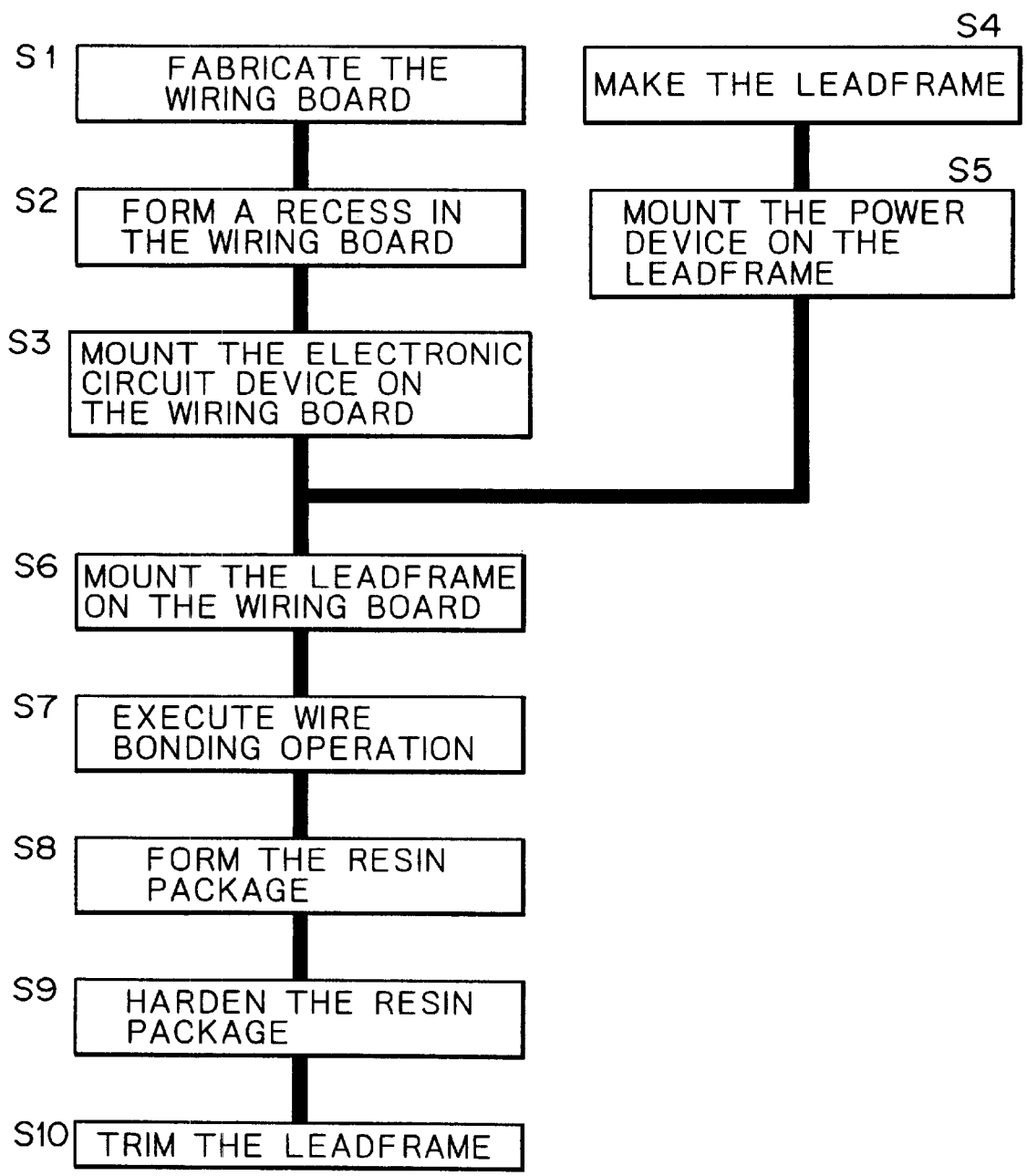
FIG. 12 is a flow chart of a method of fabricating the electronic igniter embodying the present invention.

Referring to FIG. 11 showing an electronic igniter in a third embodiment according to the present invention, a semiconductor controller 11 and a passive device 18, such as a chip resistor and/or a chip capacitor, are mounted on a ceramic wiring board 13 provided with a through-hole 14. The wiring board 13 and a power semiconductor device 17 are placed on a leadframe 15. The assembly of those component parts is integrally sealed in a resin package 21. The wiring board 13 is bonded adhesively to the leadframe 15, and the power semiconductor device 17 is connected to the leadframe 15 by soldering. FIG. 12 is a flow chart of a method of fabricating the electronic igniter and FIG. 13 is a circuit diagram of the electronic igniter. The electronic igniter is used in combination with an ignition coil to apply a high voltage to a spark plug for ignition.

The resin packages 21 in the foregoing embodiments may be formed by either a transfer molding process or an injection molding process using a thermoplastic resin.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. An electronic device comprising:

a wiring board having circuits formed thereon, the wiring board having a recess defined in a major surface thereof;

electronic circuit chip mounted on the major surface of the wiring board and spaced therefrom by a predetermined distance, the recess of the wiring board being located at a position corresponding to a central portion of the electronic circuit chip, the electronic circuit chip being electrically connected to the circuits on the wiring board; and a resin package integrally formed of a resin to seal the electronic circuit chip and the wiring board within the package, wherein the resin fills a space between the wiring board and the electronic circuit chip and only partially fills the recess defined in the major surface of the wiring board.

2. The device of claim 1, further comprising a base plate on which the wiring board is supported, wherein the base plate is sealed within the resin package.

3. An electronic igniter comprising the electronic device according to any one of claims 1 and 2.

4. A method of fabricating an electronic device comprising:

providing a wiring board having a major surface defining a recess defined therein;

mounting at least one electronic circuit chip on the major surface of the wiring board with a predetermined distance formed between the wiring board and the electronic circuit chip; and sealing the wiring board and the electronic circuit chip in a resin package, wherein the recess in the major surface of the wiring board is only partially filled with the resin.

5. The method of fabricating an electronic device according to claim 4, wherein the step of sealing the wiring board and the electronic circuit chip with the resin package is carried out by either a transfer molding process using a thermosetting resin or an injection molding process using a thermoplastic resin.

* * * * *